{12} United States Patent
Sills et al.

(10) Patent No.: US 9,691,976 B2
(45) Date of Patent: *Jun. 27, 2017

(54) INTERFACIAL CAP FOR ELECTRODE CONTACTS IN MEMORY CELL ARRAYS

(71) Applicant: Sony Semiconductor Solutions Corporation, Kanagawa (JP)

(72) Inventors: Scott Sills, Boise, ID (US); Beth Cook, Meridian, ID (US); Nirmal Ramaswamy, Boise, ID (US)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/059,489

(22) Filed: Mar. 3, 2016

(65) Prior Publication Data

US 2016/0181519 A1    Jun. 23, 2016

Related U.S. Application Data

(63) Continuation of application No. 14/147,508, filed on Jan. 4, 2014, now Pat. No. 9,306,162.

(51) Int. Cl.
*H01L 29/02* (2006.01)
*H01L 45/00* (2006.01)
*H01L 27/24* (2006.01)

(52) U.S. Cl.
CPC ...... *H01L 45/1233* (2013.01); *H01L 27/2463* (2013.01); *H01L 45/06* (2013.01); *H01L 45/08* (2013.01); *H01L 45/085* (2013.01); *H01L 45/126* (2013.01); *H01L 45/1253* (2013.01); *H01L 45/16* (2013.01); *H01L 45/1616* (2013.01); *H01L 45/1683* (2013.01)

(58) Field of Classification Search
CPC ....... H01L 45/04; H01L 45/06; H01L 45/141; H01L 27/04; H01L 21/02417; H01L 21/02568; H01L 31/0324
USPC ......................................................... 257/2, 4
See application file for complete search history.

(56) References Cited

U.S. PATENT DOCUMENTS

| 9,306,162 | B2 * | 4/2016 | Sills | ........................ H01L 45/06 |
| 2012/0008366 | A1 * | 1/2012 | Lu | ....................... G11C 13/0002 365/148 |
| 2012/0016045 | A1 * | 1/2012 | Yilmaz | .................... B01J 20/10 521/50 |
| 2013/0141967 | A1 * | 6/2013 | Cho | .................... G11C 11/5678 365/163 |

\* cited by examiner

*Primary Examiner* — Tan N Tran
(74) *Attorney, Agent, or Firm* — Sheridan Ross P.C.

(57) ABSTRACT

Exemplary embodiments of the present invention are directed towards a method for fabricated a memory cell comprising depositing a material to form an interface cap above a bulk conductive plug and below active cell materials in the memory cell.

32 Claims, 2 Drawing Sheets

US 9,691,976 B2

INTERFACIAL CAP FOR ELECTRODE CONTACTS IN MEMORY CELL ARRAYS

CROSS REFERENCE TO RELATED APPLICATIONS

This application is a continuation of U.S. patent application Ser. No. 14/147,508, filed Jan. 4, 2014, the entire disclosure of which is hereby incorporated herein by reference.

FIELD

Certain embodiments of the disclosure relate to resistive random access memory. More specifically, certain embodiments of the disclosure relate to an interfacial cap for electrode contacts for memory cell arrays.

BACKGROUND

As use of consumer and commercial electronic devices, such as computers, smart-phones, tablets, and the like, increases, the demand for greater amount of random access memory (RAM) increases to meet application requirements. However, RAM size and form factor must be scaled down to account for weight considerations in these electronic devices, i.e., the same amount of RAM must be created on a smaller size semiconductor to reduce weight. As the entirety of a RAM module is scaled down, the components of the RAM module must also be scaled down.

Generally a RAM module is composed of a plurality of memory tiles. Each of the memory tiles further comprises an array of memory cells. The memory cells each represent a "bit" in memory and contain electrode contacts. Each memory cell comprises a top electrode and a bottom electrode surface, with active cell materials between the top electrode and the bottom electrode. In scaling down RAM, oftentimes the top and bottom electrodes are reduced in size to increase memory density within a memory die. In fabricating a wafer comprised of a plurality of memory arrays with increasingly smaller electrode contacts, for each memory cell, a small via is etched into an insulating material, for example, a dielectric material. The etched via is then filled with a conductive material to form the bottom electrode using chemical vapor deposition (CVD). During the process, the conductive material film grows radially from the sidewalls of the via outward towards the center, and grows vertically from the bottom of the via. As the CVD nears completion, the chemical film generally leaves a keyhole of variable size at the center of the etched via. The chemical film is polished via chemical-mechanical planarization (CMP) so that the film only remains in the via. The CMP oftentimes creates a chemical interaction with the chemical film that increases voiding and the size of the keyhole opening. Each keyhole opening, however, varies depending on how each contact was formed, how the grains of the chemical films are nucleated and how fast the chemical film grows in each via. The different nucleations of the chemical film differ in each via and introduce variability across a semiconductor wafer, leading to unpredictable electrical characteristics such as a distribution of different cell currents and broader switching voltage range.

Additionally, in resistive ram (ReRAM), it is desired to minimize resistance to improve RC delay, minimize latency and the like. However, the direct contact between the solid plug with the active cell material makes it difficult to decouple the chemical and electronic aspects of the electrode interface from the bulk resistance of the entire plug.

Therefore, there is a need in the art for reducing the variability of electrical characteristics across a semiconductor wafer and decoupling the chemical and electronic aspects of the electrode interface in accordance with exemplary embodiments of the present invention.

SUMMARY

An apparatus and/or method is provided for an interfacial cap for electrode contacts in memory cell arrays substantially as shown in and/or described in connection with at least one of the figures, as set forth more completely in the claims.

These and other features and advantages of the present disclosure may be appreciated from a review of the following detailed description of the present disclosure, along with the accompanying figures in which like reference numerals refer to like parts throughout.

BRIEF DESCRIPTION OF THE DRAWINGS

FIG. 1 depicts a first step in the fabrication process in accordance with exemplary embodiments of the present invention;

FIG. 2 depicts a second step in the fabrication process in accordance with exemplary embodiments of the present invention;

FIG. 3 depicts a third step in the fabrication process in accordance with exemplary embodiments of the present invention;

FIG. 4 depicts a fourth step in the fabrication process in accordance with exemplary embodiments of the present invention;

FIG. 5 depicts a fifth step in the fabrication process in accordance with exemplary embodiments of the present invention;

FIG. 6 depicts a sixth step in the fabrication process in accordance, well known to those of ordinary skill in the art FIG. 7 depicts a seventh step in the fabrication process in accordance with exemplary embodiments of the present invention;

DETAILED DESCRIPTION

Certain implementations may be found in an apparatus and/or method for fabricating an interfacial (or, interface) cap for an electrode contact in a cell of a memory array. According to one embodiment a contact via is etched into a dielectric layer. The contact via is filled with a conductive material and then a recess is etched into the conductive material. The interfacial cap comprised of a conductive material is deposited in the recess above the conductive material, where the material of the interfacial cap can be varied according to the ultimate usage of the semiconductor.

Figure 1:
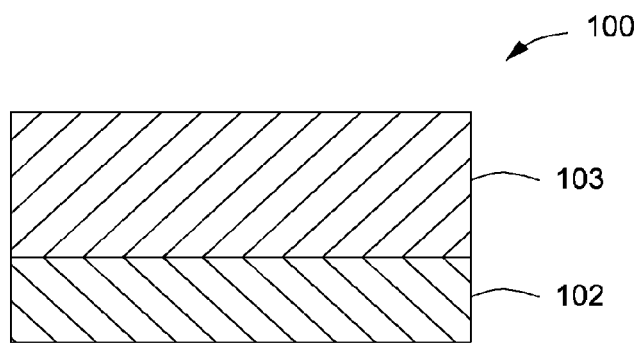
FIGS. 1-7 depict a fabrication process for an interfacial cap for electrode contacts in a memory cell in accordance with exemplary embodiments of the present invention.

FIGS. 1-7 depict a fabrication process for a an interfacial (or, interface) cap for an electrode contact to a memory cell 100 in accordance with exemplary embodiments of the present invention. FIG. 1 depicts a first step in the fabrication process of the memory cell 100. According to FIG. 1, silicon substrate 102 is used as the base layer for deposition (i.e., a semiconductor base material). The substrate 102 may comprise a material such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or the like. A dielectric layer 103 is deposited on the substrate 102. According to some embodiments, the dielectric maybe Silicon Oxide, though the present application does not limit the dielectric material.

Figure 2:
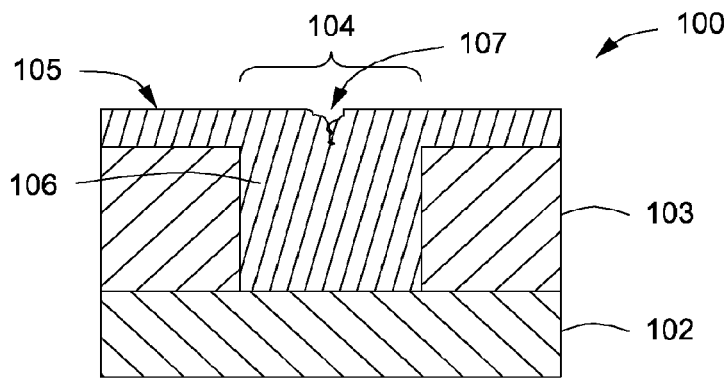

FIG. 2 depicts a second step in the fabrication process in accordance with exemplary embodiments of the present invention. A via 104 is etched into the dielectric layer 103 for eventual formation of the electrode contact. The etched via 104 is filled with a conductive material 105 using conventional deposition processes such as chemical vapor deposition (CVD) forming a bulk conductive plug (or bulk plug) 106.

According to some exemplary embodiments, the conductive material may be Titanium Nitride (TiN) or the like. The CVD process allows the bulk plug 106 to grow radially as a layer from the walls of the via 104 towards the center where a conductive film interface 107 is formed.

Figure 3:
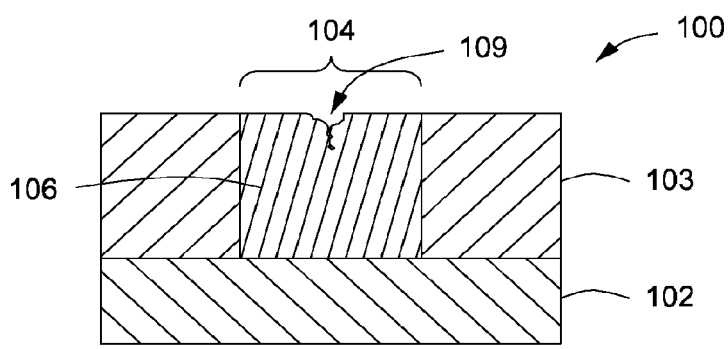

FIG. 3 depicts a third step in the fabrication process in accordance with exemplary embodiments of the present invention. CMP is performed to remove the overburden of the conductive material 105 and planarize the metal deposit at the plane of the dielectric layer 103. CMP has a variable effect on the keyhole 109 across a semiconductor wafer, depending on the grain, nucleation and speed of growth of the material forming the bulk plug 106 in the via 104. In some instances small voids may remain. Those of ordinary skill in the art will recognize that the extent of the keyhole opening 109 may vary across each cell in the semiconductor array. A physical vapor deposition (PVD) process is not used to deposit the metal layer to form the bulk plug 106 because PVD is generally not be capable of filling such small features, which are required for high density memory arrays; hence CVD-type techniques are required.

Figure 4:
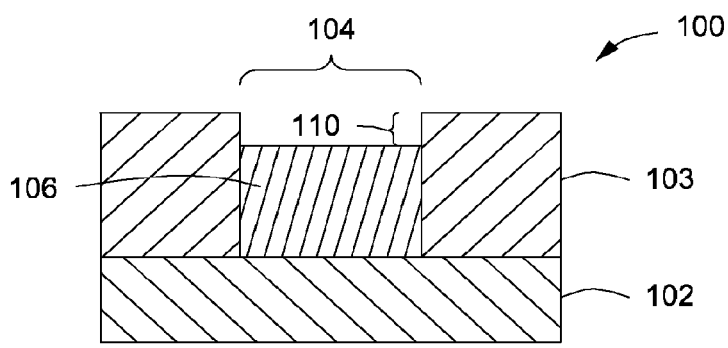

FIG. 4 depicts a fourth step in the fabrication process in accordance with exemplary embodiments of the present invention. A recess 110 is formed by performing a selective wet etch or a dry etching process after the CMP to remove a portion of metal in the etched via 104. According to some embodiments, the recess 110 is 3-6 nm in height for a given diameter, e.g., 30 nm. According to exemplary embodiments, the recess height is less than the diameter of the recess 110 to encourage planar film growth as opposed to radial film growth in a subsequent second deposition step. According to some embodiments, the bulk plug 106 has an approximate diameter of 30 nm and height of 40-70 nm, depending on use.

Figure 5:
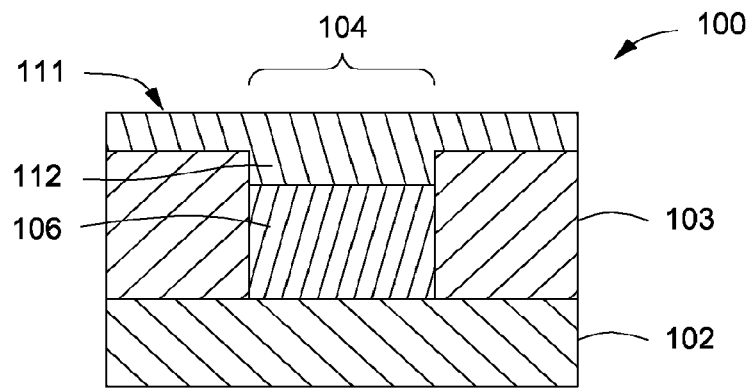

FIG. 5 depicts a fifth step in the fabrication process in accordance with exemplary embodiments of the present invention. A film is deposited in the recess 110 created in the fourth step shown in FIG. 4 to form an interface cap 112. According to some embodiments, a physical vapor deposition (PVD) process or a chemical vapor deposition (CVD) process can be used to fill the recess. According to some embodiments of the present invention, the interface cap 112 is comprised of an interface cap material with resistivity lesser than the resistivity of the material forming the bulk plug 106, i.e., the metal layer, to create a bulk resistive heating effect from the bulk plug, and to create a more stable chemical interface for device reliability, for example, a Tetrakis(dimethylamino) titanium (TDMAT TiN) plug with a tungsten W interface cap, where this provides improvement in LRS retention. In other instances, a bulk plug 106 formed using CVD TiN is employed for lower resistivity to extend cycling endurance as compared to a plug formed using monolithic TDMAT TiN. The interface (or, interfacial) cap 112 enables decoupling of interface chemical and electronic effects from the resistivity of the bulk plug 106.

Because of the shallow depth (i.e, the aspect ratio of the height verses diameter of recess 110 in the widest portion of the recess 110 is less than or equal to one), the interface cap 112 grows primarily from the bottom upwards, i.e., from the top surface of the bulk plug 106 above the planar surface of dielectric layer 103, as opposed to growing radially. The planar growth of the interface cap 112 avoids the formation of another keyhole such as keyhole 109. Additionally, the grain structure of the material used to form the interface cap 112 may differ from the grain structure of the material in the bulk plug 106, even if identical materials are used for forming the interface cap 112 and the bulk plug 106. In other embodiments, the material of interface cap 112 may partially contain carbon, may have a higher energy of formation than the bulk plug, and may act as an electromagnetic/diffusion barrier to elements comprising at least one of the bulk plug and the cell materials. According to yet another embodiment, the material forming the interface cap 112 may be one of TDMAT TiN (TiCN), Tantalum Nitrogen (TaN), WCN or TiAlN.

The introduction of the interface cap 112 allows resistance of the bulk plug 106 to be an engineering parameter during fabrication and production of the ultimate device that results from fabrication. The interface cap 112 is independent of the composition of the bulk plug 106, effectively decoupling the materials of the bulk plug 106 and the material interfacing with the active cell material 114 shown later in reference to FIG. 7. According to one embodiment, engineering the resistance of the bulk plug 106 independently from the chemical and electronic interface with the active cell materials enables an additional degree of freedom in device fabrication. For example, resistive heating may be localized at the interface with the cell material, to induce a phase change, without increasing the overall resistance in the bulk plug 106. The decreased overall resistance minimizes RC delay and improves latency of the fabricated device.

In conductive-bridge RAM (CBRAM) metal cations move to form a filament or a localized conductive region that characterizes the low resistance on-state of the memory cell. The region should form a stable contact with the bulk plug 106. The bulk plug 106 acts as the bottom electrode when the interface cap 112 is not present. The interface cap 112 acts as the bottom electrode when the interface cap 112 is present. If the bridge does not form a stable contact with the bottom electrode the contact may dissolve gradually over time, and the retention state of the ultimately fabricated device may be lost. In order to ensure retention of the programmed low resistance memory state, the chemical nature of the interface cap 112 is important to consider. The chemical nature of the interface cap 112 may also enhance the memory window, or separation between high and low resistance states. By separating the active cell materials from the bulk plug 106 using the interface cap 112, the chemical nature of the interface between the active cell materials and the bottom electrode can be finely tuned to provide appropriate retention characteristics according to fabrication requirements. For example, the interface cap 112 may be tailored to a predetermined work function or some other chemical aspect of the interface cap 112 to optimize the device reliability.

Figure 6:
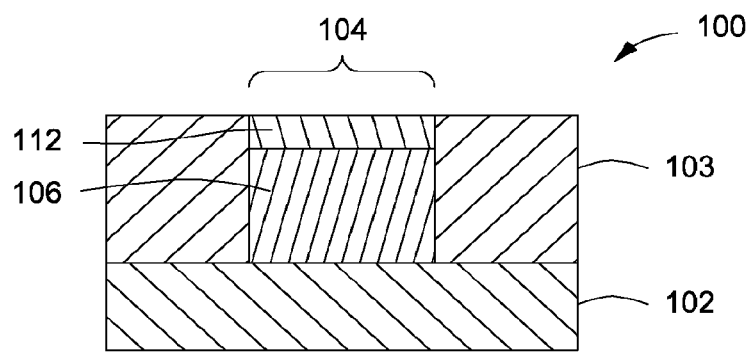

FIG. 6 depicts a sixth step in the fabrication process in accordance with exemplary embodiments of the present invention. CMP is performed to planarize the interface cap 112.

Figure 7:
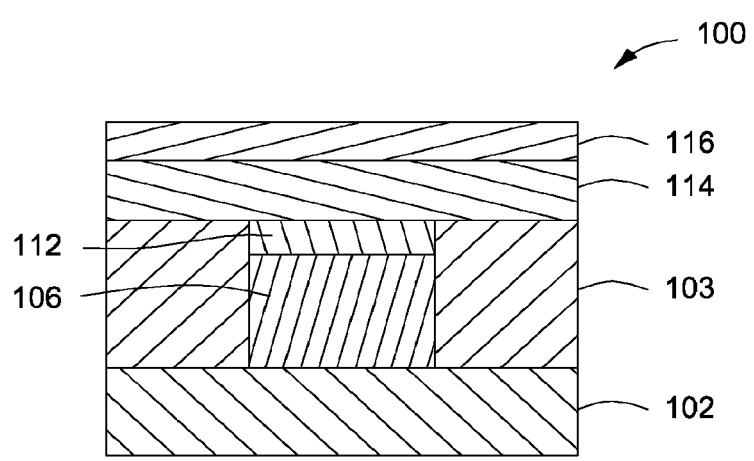

FIG. 7 depicts a seventh step in the fabrication process in accordance with exemplary embodiments of the present invention. The active cell material 114 is formed over the interface cap 112 (i.e., the bottom electrode) to known methods of deposition. The active cell material 114 comprises at least one material to facilitate switching of the memory state of the cell. Those of ordinary skill in the art will recognize that the active cell materials may form any type of RAM such as ReRAM, for example, phase-change memory (PCM), CBRAM, oxide based ReRAM, oxygen vacancy based ReRAM, or any type of RAM that uses change in electrical resistance as a retention mechanism. Additionally, the active cell material 114 may include logic gates, transistors or the like. The active cell material 114 may be comprised of one or more layers, for example, CBRAM may comprise an ion reservoir layer, and a switching layer, which may be comprised of a cell oxide or another electrolyte. A conductor material 116 is formed over the active cell material 114, to serve as the top electrode of the memory cell.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A method for fabricating a memory cell, the method comprising:
   forming a contact via in a dielectric layer;
   depositing a conductive material in the contact via;
   removing a portion of the conductive material from the contact via;
   depositing an interface cap material on a portion of the conductive material within the contact via to form an interface cap; and
   depositing an active cell material on the interface cap, wherein,
      the interface cap is between the active cell material and the conductive material,
      the interface cap is deposited in a recess which has a width greater than or equal to a height of the recess, and
      the interface cap material has a resistivity that is less than a resistivity of a material forming the conductive material.

2. The method of claim 1, further comprising:
   modifying a resistance of the interface cap independently of the resistance of the conductive material in the contact via.

3. The method of claim 1, further comprising:
   performing chemical-mechanical planarization (CMP) on the conductive material in the contact via before forming the recess and before forming the interface cap in the recess; and
   performing CMP on the interface cap material after deposition.

4. The method of claim 1, wherein the interface cap material includes tungsten (W), and wherein the conductive material in the contact via includes TDMAT TiN.

5. The method of claim 1, wherein the recess is approximately from 3 to 6 nm in height for a given diameter.

6. The method of claim 1, wherein an aspect ratio of a depth of the recess to a diameter of the recess in a widest portion of the recess is less than one.

7. The method of claim 1, further comprising:
   depositing the interface cap material in the recess using physical vapor deposition or chemical vapor deposition (CVD).

8. The method of claim 7 further comprising:
   depositing the conductive material in the contact via using CVD.

9. The method of claim 8, further comprising:
   forming the recess to a particular depth to eliminate a keyhole opening in the conductive material in the contact via.

10. The method of claim 1, wherein the contact via is etched in the dielectric layer.

11. The method of claim 1, wherein the conductive material in the contact via is approximately 40-70 nm in height.

12. The method of claim 1, wherein the interface cap includes carbon.

13. The method of claim 1, further comprising:
    forming the interface cap with a higher energy of formation than the conductive material in the contact via.

14. The method of claim 1, further comprising:
    forming the interface cap so that the interface cap acts as an electromagnetic/diffusion barrier to elements included in at least one of the conductive material in the contact via and the active cell material.

15. The method of claim 1, further comprising:
    forming the interface cap using one of TDMAT TiN, TaN, WCN, or TiAlN.

16. The method of claim 1, further comprising:
    forming the interface cap on an etched portion of the conductive material within the contact via.

17. The method of claim 1, further comprising:
    forming the interface cap of a material that has a predetermined work function.

18. A device comprising:
    a contact via in a dielectric layer;
    a conductive material in the contact via;
    an interfacial cap disposed on a portion of the conductive material within the contact via; and
    an active cell material,
    wherein,
       the interfacial cap is between the active cell material and the conductive material,
       the interfacial cap has a width greater than or equal to a height, and
       the interfacial cap includes a material having a resistivity that is less than a resistivity of a material forming the conductive material.

19. The device of claim 18, wherein the device forms a memory cell, and wherein the memory cell comprises one of phase-change memory, resistive ram (ReRAM), conductive-bridge RAM (CBRAM), or a logic gate.

20. The device of claim 18, wherein the interfacial cap material is Tungsten (W) and the conductive material in the contact via is TDMAT TiN.

21. The device of claim 18, wherein the interfacial cap material is Tungsten (W) and the conductive material in the contact via is CVD TiN.

22. The device of claim 21, wherein the interfacial cap extends cycling endurance of the device because of the CVD TiN.

23. The device of claim 18, wherein the interfacial cap includes a grain structure different from a grain structure of the conductive material in the contact via.

24. The device of claim 18, wherein the interfacial cap includes carbon.

25. The device of claim 18, wherein the interfacial cap has a higher energy of formation than the conductive material in the contact via.

26. The device of claim 18, wherein the interfacial cap includes one of TDMAT TiN (TiCN), Tantalum Nitrogen (TaN), WCN or TiAlN.

27. The device of claim 18, wherein a resistance of the conductive material in the contact via is engineered independently from a chemical and electronic interface of the active cell materials.

28. The device of claim 18, wherein resistive heating is localized at the interfacial cap without increasing resistance in the conductive material in the contact via.

29. The device of claim 18, wherein the interfacial cap is tailored to have a predetermined work function.

30. The device of claim 18, wherein the interfacial cap is disposed on an etched portion of the conductive material within the contact via.

31. An electronic device comprising a plurality of memory tiles including an array of memory cells, each cell including:
    a contact via in a dielectric layer;
    a conductive material in the contact via;
    an interfacial cap disposed on a portion of the conductive material within the contact via; and
    an active cell material,
    wherein,
        the interfacial cap is between the active cell material and the conductive material,
        the interfacial cap has a width greater than or equal to a height, and
        the interfacial cap includes a material having a resistivity that is less than a resistivity of a material forming the conductive material.

32. The electronic device of claim 31, wherein the interfacial cap is disposed on an etched portion of the conductive material within the contact via.

* * * * *